United States Patent
Kawai et al.

(10) Patent No.: US 12,520,534 B2
(45) Date of Patent: Jan. 6, 2026

(54) NORMALLY-OFF MODE POLARIZATION SUPER JUNCTION GaN-BASED FIELD EFFECT TRANSISTOR AND ELECTRICAL EQUIPMENT

(71) Applicant: POWDEC K.K., Oyama (JP)

(72) Inventors: Hiroji Kawai, Oyama (JP); Shuichi Yagi, Oyama (JP); Hironobu Narui, Oyama (JP)

(73) Assignee: POWDEC K.K., Oyama (JP)

( * ) Notice: Subject to any disclaimer, the term of this patent is extended or adjusted under 35 U.S.C. 154(b) by 369 days.

(21) Appl. No.: 18/276,982

(22) PCT Filed: Oct. 5, 2021

(86) PCT No.: PCT/JP2021/036733
§ 371 (c)(1),
(2) Date: Aug. 11, 2023

(87) PCT Pub. No.: WO2022/172503
PCT Pub. Date: Aug. 18, 2022

(65) Prior Publication Data
US 2024/0120404 A1    Apr. 11, 2024

(30) Foreign Application Priority Data
Feb. 15, 2021 (JP) ................. 2021-021398

(51) Int. Cl.
*H10D 30/67* (2025.01)
*H10D 30/47* (2025.01)
(Continued)

(52) U.S. Cl.
CPC ......... *H10D 30/675* (2025.01); *H10D 30/475* (2025.01); *H10D 30/6738* (2025.01);
(Continued)

(58) Field of Classification Search
CPC .............. H10D 30/675; H10D 30/475; H10D 30/6738; H10D 62/85; H10D 62/8503;
(Continued)

(56) References Cited

U.S. PATENT DOCUMENTS

2013/0126942 A1* 5/2013 Nakajima ............ H10D 62/106
257/192
2015/0311329 A1 10/2015 Nakazawa et al.
(Continued)

FOREIGN PATENT DOCUMENTS

JP 2010258313 A 11/2010
JP 5669119 B1 2/2015
(Continued)

OTHER PUBLICATIONS

International Search Report from corresponding PCT application PCT/JP2021/034029, dated Nov. 22, 2021.
(Continued)

*Primary Examiner* — Syed I Gheyas
(74) *Attorney, Agent, or Firm* — K&L Gates LLP

(57) ABSTRACT

This normally-off mode polarization super junction GaN-based field effect transistor has an undoped GaN layer 11, an $Al_xGa_{1-x}N$ layer 12 ($0<x<1$), an island-like undoped GaN layer 13, a p-type GaN layer 14, a p-type $In_yGa_{1-y}N$ layer 15 ($0<y<1$), a gate electrode 16 on the p-type $In_yGa_{1-y}N$ layer 15 and a source electrode 17 and a drain electrode 17 on the $Al_xGa_{1-x}N$ layer 12. When the polarization charge amount of the hetero-interface between the $Al_xGa_{1-x}N$ layer 12 and the undoped GaN layer 11 and the hetero-interface between the $Al_xGa_{1-x}N$ layer 12 and the undoped GaN layer 13 is denoted as $N_{PZ}$ and the thickness of the $Al_xGa_{1-x}N$ layer 12 is denoted as d, $N_{PZ} d \leq 2.64 \times 10^{14}$ [cm$^{-2}$ nm] is satisfied.

4 Claims, 6 Drawing Sheets

(51) Int. Cl.
*H10D 62/85* (2025.01)
*H10D 64/64* (2025.01)

(52) U.S. Cl.
CPC ......... *H10D 62/85* (2025.01); *H10D 62/8503* (2025.01); *H10D 64/64* (2025.01)

(58) Field of Classification Search
CPC .. H10D 64/64; H10D 30/051; H10D 30/0612; H10D 30/83; H10D 30/87; H10D 62/852; H10D 64/411; H10D 62/343
See application file for complete search history.

(56) References Cited

U.S. PATENT DOCUMENTS

2016/0093691 A1\* 3/2016 Echigoya ................. H10D 8/60
 257/76
2017/0263710 A1\* 9/2017 Matsumoto .......... H10D 62/824

FOREIGN PATENT DOCUMENTS

JP         5828435 B1     12/2015
WO      2011162243 A1   12/2011
WO      2014097526 A1    6/2014

OTHER PUBLICATIONS

Mizutani et al.; "AlGaN/GaN HEMTs With Thin InGaN Cap Layer for Normally Off Operation"; IEEE Electron Device Letters, vol. 28, No. 7, Jul. 2007, pp. 549-551. (3 pages).

Li et al.; "Normally-off mode AlGaN/GaN HEMTs with p-InGaN Cap Layer"; The Institute of Electronics, Information and Communication Engineers Technical Report; 2008. (5 pages.).

0. Ambacher et al.; "Two-dimensional electron gases induced by sponta neons and piezoelectric polarization charges In N- and Ga-face AlGaN/GaN heterostructures"; J. Appl. Phys .; Mar. 15, 1999; 85; 3222-3233, fig.9.

Office action issued in corresponding Japanese Patent Application No. 2021-021398, dated Jun. 3, 2021. (4 pages.).

\* cited by examiner

NORMALLY-OFF MODE POLARIZATION SUPER JUNCTION GaN-BASED FIELD EFFECT TRANSISTOR AND ELECTRICAL EQUIPMENT

TECHNICAL FIELD

The present invention relates to a normally-off mode polarization super junction GaN (gallium nitride)-based field effect transistor and electrical equipment using the normally-off mode polarization super junction GaN-based field effect transistor.

BACKGROUND ART

Conventionally, polarization super junction (psj) GaN-based field effect transistors (FETs) are known as power transistors (see patent literatures 1, 2). The polarization super junction GaN-based field effect transistor has a polarization super junction region including a structure in which an undoped GaN layer, an $Al_xGa_{1-x}N$ layer and an undoped GaN layer are stacked in order. The polarization super junction GaN-based field effect transistor can realize high voltage resistance, high output, high efficiency and high speed operation, which are difficult to realize by silicon (Si)-based power transistors.

In AlGaN/GaN HEMT (High Electron Mobility Transistor), it is known to realize a normally-off mode by forming an undoped InGaN layer or a p-type InGaN layer on an AlGaN layer and forming a gate electrode thereon (see non-patent literatures 1, 2).

PRIOR ART LITERATURE

Patent Literature

[PATENT LITERATURE 1] Gazette of U.S. Pat. No. 5,828,435
[PATENT LITERATURE 2] Gazette of U.S. Pat. No. 5,669,119

Non-Patent Literature

[NON-PATENT LITERATURE 1] Mizutani et al., "AlGaN/GaN HEMTs with thin InGaN cap layer for normally-off operation", IEEE Electron Device Letters, Vol. 28, No. 7, p. 549, July (2007)
[NON-PATENT LITERATURE 2] Ri asahi et al., "Normally-off mode AlGaN/GaN HEMTs using a p-InGaN cap layer", IEICE technical report,
[NON-PATENT LITERATURE 3] O. Ambacher et al., "Two dimensional electron gas induced by spontaneous and piezoelectric polarization charges in N-face and Ga-face AlGaN/GaN heterostructures", J. Appl. Phys., 85, pp. 3222-3233, 1999

SUMMARY OF INVENTION

Subjects to be Solved by Invention

The polarization super junction GaN-based field effect transistors described in patent literatures 1, 2 are mainly the so-called normally-on mode transistors in which current flows between the source electrode and the drain electrode when a voltage is applied between the source electrode and the drain electrode in a state of gate voltage $V_g=0$ V or an open state because two-dimensional electron gas (2DEG) exists in the undoped GaN layer in the vicinity part of a hetero-interface between the lower undoped GaN layer and the $Al_xGa_{1-x}N$ layer including also the part just below the gate electrode in the equilibrium state.

On the other hand, in many cases, transistors are requested the so-called fail safe operation in which the transistor is in off state when the control signal (gate signal) is lost. Regarding the normally-on mode polarization super junction GaN-based field effect transistors described in patent literatures 1, 2, it is possible to realize normally-off mode by making a cascode circuit or modified cascode circuit using low voltage resistance normally-off mode Si MOS transistors. However, it is disadvantageous because it invites complication of the circuit.

Therefore, the subject to be solved by the invention is to provide a normally-off mode polarization super junction GaN-based field effect transistor which can realize a normally-off mode transistor easily without using complicated circuits and a high performance electrical equipment using the normally-off mode polarization super junction GaN-based field effect transistor.

Means to Solve the Subjects

In order to solve the subject, according to the invention, there is provided a normally-off mode polarization super junction GaN-based field effect transistor, comprising:
a first undoped GaN layer,
an $Al_xGa_{1-x}N$ layer ($0<x<1$) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer ($0<y<1$) on the p-type GaN layer,
a gate electrode electrically connected to the p-type $In_yGa_{1-y}N$ layer,
a source electrode on the $Al_xGa_{1-x}N$ layer; and
a drain electrode on the $Al_xGa_{1-x}N$ layer,
the p-type GaN layer existing on the whole surface of the second undoped GaN layer or on only one side of the surface of the second undoped GaN layer on the side of the source electrode,
the p-type $In_yGa_{1-y}N$ layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode.

In the normally-off mode polarization super junction GaN-based field effect transistor, the gate threshold voltage>0 V. In the normally-off mode polarization super junction GaN-based field effect transistor, at a non-operating time (thermal equilibrium state), a two-dimensional hole gas (2DHG) is formed in the second undoped GaN layer in the vicinity part of a hetero-interface between the $Al_xGa_{1-x}N$ layer and the second undoped GaN layer and a two-dimensional electron gas (2DEG) is formed in the first undoped GaN layer in the vicinity part of a hetero-interface between the first undoped GaN layer and the $Al_xGa_{1-x}N$ layer except the part just below the gate electrode. Typically, when the polarization charge amount at the interface between the $Al_xGa_{1-x}N$ layer and the first undoped GaN layer and the interface between the $Al_xGa_{1-x}N$ layer and the second undoped GaN layer is denoted as $N_{PZ}$ and the thickness of the $Al_xGa_{1-x}N$ layer is denoted as d, $$N_{PZ}d \leq 2.64 \times 10^{14} \text{ [cm}^{-2}\text{ nm]}$$

is satisfied. The sheet resistance of the epi substrate in which the first undoped GaN layer, the $Al_xGa_{1-x}N$ layer, the second undoped GaN layer, the p-type GaN layer and the p-type $In_yGa_{1-y}N$ layer are stacked on the whole surface of a substrate is preferably not smaller than 20 kΩ/□, more preferably not smaller than 45 kΩ/□. These conditions will be described in details later. The In composition y of the p-type $In_yGa_{1-y}N$ layer is typically 0<y<1.

If the normally-off mode polarization super junction GaN-based field effect transistor has the structure similar to the patent literature 1, the polarization super junction region is made of the first undoped GaN layer, the $Al_xGa_{1-x}N$ layer and the second undoped GaN layer of the part in which the p-type GaN layer does not exists. The thickness of the first undoped GaN layer, the thickness of the second undoped GaN layer and the like are typically selected based on patent literature 1. If the normally-off mode polarization super junction GaN-based field effect transistor has the structure similar to the patent literature 2, the polarization super junction region is made of the first undoped GaN layer, the $Al_xGa_{1-x}N$ layer, the second undoped GaN layer and the p-type GaN layer. The thickness of the first undoped GaN layer, the thickness of the second undoped GaN layer, the thickness and the impurity concentration of the p-type GaN layer and the like are typically selected based on patent literature 2. The $Al_xGa_{1-x}N$ layer is typically undoped, though the $Al_xGa_{1-x}N$ layer may be an n-type or a p-type $Al_xGa_{1-x}N$ layer doped with donors (n-type impurities) or acceptors (p-type impurities), for example a Si-doped n-type $Al_xGa_{1-x}N$ layer.

In the normally-off mode polarization super junction GaN-based field effect transistor, as necessary, an $Al_uGa_{1-u}N$ layer (where 0<u≤1, u>x), typically undoped, for example an AlN layer may be provided between the first undoped GaN layer and the $Al_xGa_{1-x}N$ layer and/or between the second undoped GaN layer and the $Al_xGa_{1-x}N$ layer. By providing the $Al_uGa_{1-u}N$ layer between the second undoped GaN layer and the $Al_xGa_{1-x}N$ layer, permeation of the two-dimensional hole gas formed in the second undoped GaN layer in the vicinity part of the hetero-interface between the second undoped GaN layer and the $Al_xGa_{1-x}N$ layer into the $Al_xGa_{1-x}N$ layer can be reduced, and mobility of holes can be increased dramatically. Also, by providing the $Al_uGa_{1-u}N$ layer between the first undoped GaN layer and the $Al_xGa_{1-x}N$ layer, permeation of the two-dimensional electron gas formed in the first undoped GaN layer in the vicinity part of the hetero-interface between the first undoped GaN layer and the $Al_xGa_{1-x}N$ layer into the $Al_xGa_{1-x}N$ layer can be reduced, and mobility of electrons can be increased dramatically. The $Al_uGa_{1-u}N$ layer may be generally sufficiently thin, for example, about 0.5~2 nm.

Furthermore, according to the invention, there is provided electrical equipment, comprising:
at least a transistor,
the transistor being
a normally-off mode polarization super junction GaN-based field effect transistor, comprising:
a first undoped GaN layer,
an $Al_xGa_{1-x}N$ layer (0<x<1) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer (0<y<1) on the p-type GaN layer,
a gate electrode electrically connected to the p-type $In_yGa_{1-y}N$ layer,
a source electrode on the $Al_xGa_{1-x}N$ layer; and
a drain electrode on the $Al_xGa_{1-x}N$ layer,
the p-type GaN layer existing on the whole surface of the second undoped GaN layer or on only one side of the surface of the second undoped GaN layer on the side of the source electrode,
the p-type $In_yGa_{1-y}N$ layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode.

Here, the electrical equipment includes all equipment using electricity and their uses, functions, sizes and the like are not limited. They are, for example, electronic equipment, mobile bodies, power plants, construction machinery, machine tools and the like. The electronic equipment are, for example, robots, computers, game equipment, car equipment, home electric products (air conditioners and the like), industrial products, mobile phones, mobile equipment, IT equipment (servers and the like), power conditioners used in solar power generation systems, power supplying systems and the like. The mobile bodies are railroad cars, motor vehicles (electric cars and the like), motorcycles, aircrafts, rockets, spaceships and the like.

In the invention of the electrical equipment, other than the above, the explanation concerning the above invention of the normally-off mode polarization super junction field effect transistor comes into effect unless it is contrary to its character.

Effect of the Invention

According to the invention, it is possible to easily realize a normally-off mode polarization super junction field effect transistor without using complicated circuits because the two-dimentional electron gas does not exist substantially just below the gate electrode at a non-operating time (in thermal equilibrium) and it is possible to realize high performance electrical equipment using the normally-off mode polarization super junction field effect transistor.

MODES FOR CARRYING OUT THE INVENTION

Modes for carrying out the invention (hereinafter referred as embodiments) will now be explained below.

The First Embodiment

[The Normally-Off Mode Polarization Super Junction GaN-Based FET]

Figure 1:
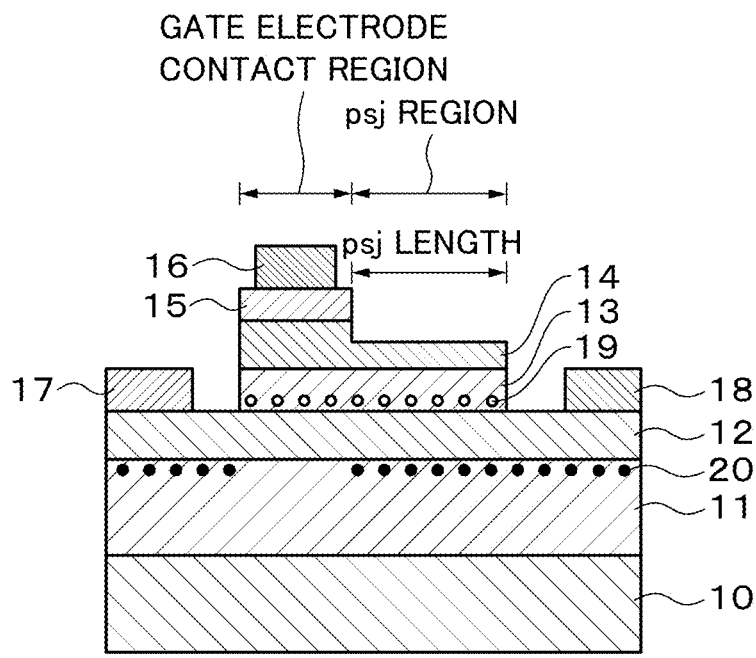
FIG. 1 A cross-sectional view showing a normally-off mode polarization super junction GaN-based FET according to a first embodiment of the invention.

As shown in FIG. 1, in the normally-off mode polarization super junction GaN-based FET according to the first embodiment, an undoped GaN layer 11, an $Al_xGa_{1-x}N$ layer 12 and an undoped GaN layer 13 are stacked in order on a substrate 10 via a buffer layer (not illustrated). The substrate 10 is preferably a substrate on which GaN-based semiconductor grows in C-plane orientation such as, for example, a C-plane sapphire substrate, a Si substrate, a SiC substrate and the like. The buffer layer is made of, for example, polycrystalline or amorphous GaN, AlN, AlGaN, further AlGaN/GaN superlattice and the like. The $Al_xGa_{1-x}N$ layer 12 is typically undoped, but may be n-type or p-type $Al_xGa_{1-x}N$ layer doped with donors (n-type impurities) or acceptors (p-type impurities). The undoped GaN layer 13 has an island-like shape. The $Al_xGa_{1-x}N$ layer 12 is exposed around the undoped GaN layer 13. A p-type GaN layer 14 is stacked on the whole surface of the undoped GaN layer 13. The thickness of a part of the p-type GaN layer 14 on the side of a drain electrode 18 which will be described later is smaller than the thickness of a part of the p-type GaN layer 14 on the side of a source electrode 17 which will be described later. The part of the p-type GaN layer 14 having the smaller thickness corresponds to the polarization super junction region (psj region). A p-type $In_yGa_{1-y}N$ layer 15 is stacked on the whole surface of the part of the p-type GaN layer 14 having the larger thickness. The p-type GaN layer 14 is doped with magnesium (Mg) as p-type impurities. The p-type $In_yGa_{1-y}N$ layer 15 is also doped with Mg. The In composition y and the thickness t of the p-type $In_yGa_{1-y}N$ layer 15 is selected as necessary and the In composition y is typically selected to be not larger than 0.20. The In composition y and the thickness t are typically selected to satisfy y×t≤0.20×5 [nm] generally. For example, if y=0.10, t is selected to be about t=10 nm or smaller than this.

A gate electrode 16 is provided on the p-type $In_yGa_{1-y}N$ layer 15. The gate electrode 16 is made of metals having large work function, for example, typically nickel (Ni) so as to bring it ohmic contact with the p-type $In_yGa_{1-y}N$ layer 15. The gate electrode 16 may be made of a layered film made of a Ni film and another metal film stacked thereon. The source electrode 17 is provided on the $Al_xGa_{1-x}N$ layer 12 at a part on the side of the p-type $In_yGa_{1-y}N$ layer 15 with respect to the island-like layered structure made of the undoped GaN layer 13, the p-type GaN layer 14 and the p-type $In_yGa_{1-y}N$ layer 15 and the drain electrode 18 is provided on the $Al_xGa_{1-x}N$ layer 12 at a part on the opposite side with respect to the island-like layered structure. The source electrode 17 and the drain electrode 17 are made of metals having small work function, typically, for example, titanium (Ti) so as to bring it ohmic contact with the 2DEG formed in the undoped GaN layer 11 in the vicinity part of the hetero-interface between the undoped GaN layer 11 and the $Al_xGa_{1-x}N$ layer 12 as described later. The source electrode 17 and the drain electrode 17 may be made of a layered film made of a Ti film and aluminum (Al) film, nickel (Ni) film, gold (Au) film and the like stacked thereon.

In the normally-off mode polarization super junction GaN-based FET, a part of the p-type GaN layer 14 having the smaller thickness and the undoped GaN layer 13, the $Al_xGa_{1-x}N$ layer 12 and the undoped GaN layer 11 which are just below the part form the polarization super junction region (intrinsic polarization super junction region). The p-type $In_yGa_{1-y}N$ layer 15, a part of the p-type GaN layer 14 having the larger thickness and the undoped GaN layer 13, the $Al_xGa_{1-x}N$ layer 12 and the undoped GaN layer 11 which are just below the p-type GaN layer 14 form a gate electrode contact region.

In the normally-off mode polarization super junction GaN-based FET, due to piezo polarization and spontaneous polarization, positive fixed charge is induced in the $Al_xGa_{1-x}N$ layer 12 in the vicinity part of the hetero-interface between the undoped GaN layer 11 and the $Al_xGa_{1-x}N$ layer 12 on the side of the substrate 10, and negative fixed charge is induced in the $Al_xGa_{1-x}N$ layer 12 in the vicinity part of the hetero-interface between the $Al_xGa_{1-x}N$ layer 12 and the undoped GaN layer 13 on the opposite side of the substrate 10. As a result, in the normally-off mode polarization super junction GaN-based FET, at a non-operating time (thermal equilibrium state), a 2DHG 21 is formed in the undoped GaN layer 13 in the vicinity part of the hetero-interface between the $Al_xGa_{1-x}N$ layer 12 and the undoped GaN layer 13 and a 2DEG 22 is formed in the undoped GaN layer 11 in the vicinity part of the hetero-interface between the undoped GaN layer 11 and the $Al_xGa_{1-x}N$ layer 12.

In the normally-off mode polarization super junction GaN-based FET, at a non-operating time (thermal equilibrium state), no 2DEG 22 is formed in the part just below the gate electrode 16. That is, the gate threshold voltage $V_{th}$>0.

In order to form the 2DEG 22 in the part just below the gate electrode 16, it is necessary to apply the positive gate voltage $V_g$ which is larger than $V_{th}$ to the gate electrode 16.

In the normally-off mode polarization super junction GaN-based FET, if the polarization charge amount at the hetero-interface between the $Al_xGa_{1-x}N$ layer 12 and the undoped GaN layer 11 and the hetero-interface between the $Al_xGa_{1-x}N$ layer 12 and the undoped GaN layer 13 is denoted as $N_{PZ}$ and the thickness of the $Al_xGa_{1-x}N$ layer 12 is denoted as d, $$N_{PZ}d \leq 2.64 \times 10^{14} \text{ [cm}^{-2} \text{ nm]}$$

is satisfied. The sheet resistance of the epi substrate in which the undoped GaN layer 11, the $Al_xGa_{1-x}N$ layer 12, the undoped GaN layer 13, the p-type GaN layer 14 and the p-type $In_yGa_{1-y}N$ layer 15 are stacked on the whole surface of the substrate 10 is preferably not smaller than 20 k$\Omega$/□, more prefably not smaller than 45 k$\Omega$/□. The In composition y and the thickness t of the p-type $In_yGa_{1-y}N$ layer 15 are selected as necessary. The In composition y is typically selected to be not larger than 0.20. The In composition y and the thickness t are typically selected to satisfy $y \times t \leq 0.20 \times 5$ [nm] generally. For example, if y=0.10, t is selected to be about t=10 nm or smaller than this.

[Method for Manufacturing the Normally-Off Mode Polarization Super Junction GaN-Based FET]

First, for example, by the conventionally known MOCVD (metal organic chemical vapor deposition) method using TMG (trimethyl gallium) as Ga source, TMA (trimethyl aluminium) as Al source, $NH_3$ (ammonia) as nitrogen source, $N_2$ gas and $H_2$ gas as carrier gas, a buffer layer, the undoped GaN layer 11, the $Al_xGa_{1-x}N$ layer 12, the undoped GaN layer 13, the p-type GaN layer 14 and the p-type $In_yGa_{1-y}N$ layer 15 are epitaxially grown in order on the substrate 10. The growth temperature of the undoped GaN layer 11, the $Al_xGa_{1-x}N$ layer 12, the undoped GaN layer 13 and the p-type GaN layer 14 is, for example, about 1100° C. The growth temperature of the p-type $In_yGa_{1-y}N$ layer 15 is for example about 950° C. which is lower than the growth temperature of the undoped GaN layer 11, the $Al_xGa_{1-x}N$ layer 12, the undoped GaN layer 13 and the p-type GaN layer 14 by about 150° C. As the substrate 10, a sapphire substrate (for example, a C-plane sapphire substrate), a Si substrate, a SiC substrate and the like can be used. As the buffer layer, a GaN layer, an AlN layer, an AlGaN/GaN superlattice layer and the like can be used. When, for example, the GaN layer is used as the buffer layer, it is grown in low temperature of, for example, about 530° C. As the p-type dopant for growing the p-type GaN layer 14, bis-cyclopentadienyl magnesium ($Cp_2$ Mg) is used. As the carrier gas for growing the p-type GaN layer 14, hydrogen ($H_2$) and nitrogen ($N_2$) are used. As the carrier gas for growing the p-type $In_yGa_{1-y}N$ layer 15, typically 100% $N_2$ is used.

Then, a mask such as a resist pattern having a shape corresponding to the device forming region is formed on the p-type $In_yGa_{1-y}N$ layer 15. Thereafter, the p-type $In_yGa_{1-y}N$ layer 15, the p-type GaN layer 14, the undoped GaN layer 13, the $Al_xGa_{1-x}N$ layer 12 and the undoped GaN layer 11 are sequentially etched to the depth midway in the thickness direction of the undoped GaN layer 11 using the mask to carry out patterning into the predetermined shape. As a result, device isolation is carried out. Thereafter, the mask is removed.

Then, a mask such as a resist pattern having a planar shape corresponding to the p-type $In_yGa_{1-y}N$ layer 15 shown in FIG. 1 is formed on the p-type $In_yGa_{1-y}N$ layer 15. Thereafter, the p-type $In_yGa_{1-y}N$ layer 15 and the p-type GaN layer 14 are sequentially etched to the depth midway in the thickness direction of the p-type GaN layer 14 using the mask to perform patterning into the predetermined shape. Thereafter, the mask is removed.

Then, a mask such as a resist pattern having a planar shape corresponding to the undoped GaN layer 13 shown in FIG. 1 is formed to cover the p-type $In_yGa_{1-y}N$ layer 15 and the p-type GaN layer 14. Thereafter, the undoped GaN layer 13 is etched using the mask until the $Al_xGa_{1-x}N$ layer 12 is exposed to carry out patterning into the predetermined shape. Thereafter, the mask is removed.

Then, the source electrode 17 and the drain electrode 18 are formed on the $Al_xGa_{1-x}N$ layer 12. Thereafter, the gate electrode 16 is formed on the p-type $In_yGa_{1-y}N$ layer 15.

In this way, the target normally-off mode polarization super junction GaN-based FET shown in FIG. 1 is manufactured.

The normally-off mode polarization super junction GaN-based FET was considered. The result is described.

First, samples were prepared for consideration. That is, first, a C-plane sapphire substrate was used as the substrate 10 and epitaxially grown in order thereon by the MOCVD method were a GaN low temperature buffer layer having a thickness of 30 nm, the undoped GaN layer 11 having a thickness of 3000 nm, the $Al_xGa_{1-x}N$ layer 12 having a thickness of 20 nm and x=0.21, the undoped GaN layer 13 having a thickness of 30 nm, the p-type GaN layer 14 having a thickness of 20 nm and Mg concentration [Mg]=$5 \times 10^{19}$ cm$^{-3}$ and the p-type $In_yGa_{1-y}N$ layer 15 having a thickness of 50 nm, y=0.20 and Mg concentration [Mg]=$1 \times 10^{20}$ cm$^{-3}$. The growth temperature of the undoped GaN layer 11, the $Al_xGa_{1-x}N$ layer 12, the undoped GaN layer 13 and the p-type GaN layer 14 was set to 1100° C. The growth temperature of the p-type $In_yGa_{1-y}N$ layer 15 was set to 950° C. As carrier gas during growth, 100% $N_2$ was used. The epi substrate thus obtained is used as a sample 1. Only the thickness of the $Al_xGa_{1-x}N$ layer 12 was changed to 15 nm and the similar epitaxial growth was carried out on the C-plane sapphire substrate. The epi substrate thus obtained is used as a sample 2.

The sheet resistance of the samples 1, 2 was measured by eddy current method. As a result, the sheet resistance (average value) of the samples 1, 2 were 45300$\Omega$/□ and 77500$\Omega$/□, respectively.

In addition to the samples 1, 2, only the undoped GaN layer 11 and the $Al_xGa_{1-x}N$ layer 12, which are the base layers of the sample 1, were grown on the C-plane sapphire substrate. The epi substrate thus obtained is used as a sample 3. The sheet resistance of the sample 3 was measured by eddy current method. As a result, the sheet resistance (average value) was 578$\Omega$/□. Incomparably large sheet resistance of the samples 1, 2 compared with the sample 3 means that in the samples 1, 2, the energy band was greatly lifted up by the p-type $In_yGa_{1-y}N$ layer 15/the p-type GaN layer 14/the undoped GaN layer 13 stacked on the AlGaN/GaN base layer (the undoped GaN layer 11 and the $Al_xGa_{1-x}N$ layer 12) to greatly decrease the 2DEG concentration and the 2DEG was almost depleted.

A polarization super junction GaN-based FET was prepared based on the manufacturing method described above using the samples 1, 2.

First, etching for device isolation was carried out to the depth of about 200 nm from the surface of the samples 1, 2 by ICP (induction coupled plasma)-RIE (reactive ion etching) using chlorine (Cl)-based gas.

Then, the gate electrode contact region was masked and the p-type GaN layer 14 was etched to the depth midway in the thickness direction until the remained thickness of the p-type GaN layer 14 reaches 10 nm. Thereafter, the gate electrode contact region and the psj region were masked and finally the undoped GaN layer 13 was etched to expose the $Al_xGa_{1-x}N$ layer 12.

Then, the surface of the region except the region in which the source electrode 17 and the drain electrode 18 are formed was masked by an $SiO_2$ film and a Ti/Al/Ni/Au layered film was formed on the source electrode forming part and the drain electrode forming part by the vacuum evaporation method to form the source electrode 17 and the drain electrode 18. Thereafter, ohmic alloy treatment of 800° C. and 60 seconds was carried out in $N_2$.

Then, the surface of the region except the region in which the gate electrode 16 is formed was masked by an $SiO_2$ film and a Ti/Ni/Au layered film was formed on the p-type $In_yGa_{1-y}N$ layer 15 by the vacuum evaporation method to form the gate electrode 16. Thereafter, ohmic alloy treatment was carried out by carrying out a rapid thermal annealing (RTA) of 500° C. and 100 seconds in $N_2$.

Thereafter, using a polyimide mask Au was deposited by electroplating to a thickness of about 2 μm on the source electrode 17 and the drain electrode 18.

The voltage resistance of the polarization super junction GaN-based FET depends on the length of the psj region. Here, the psj length was set to 20 μm.

The FET prepared using the sample 1 is referred as the FET 1 and the FET prepared using the sample 2 is referred as the FET 2.

Transistor characteristics of the FET 1 and the FET 2 were measured.

(Drain Current ($I_d$)—Drain Voltage ($V_d$) Characteristics)

Figure 2:
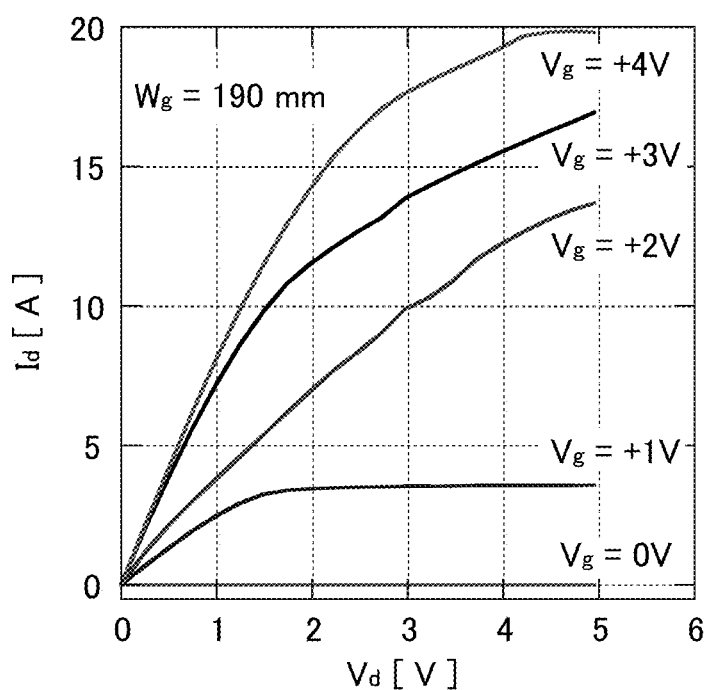
FIG. 2 A schematic view showing the drain current-drain voltage characteristics of the FET 1 prepared to consider the normally-off mode polarization super junction GaN-based FET according to the first embodiment of the invention.
Figure 3:
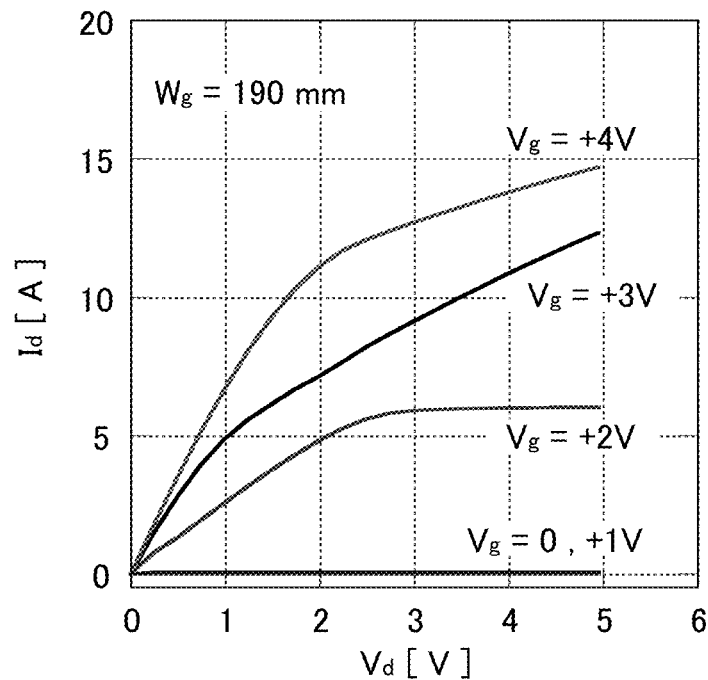
FIG. 3 A schematic view showing the drain current-drain voltage characteristics of the FET 2 prepared to consider the normally-off mode polarization super junction GaN-based FET according to the first embodiment of the invention.

FIG. 2 and FIG. 3 show the $I_d$-$V_d$ characteristics of the FET 1 and the FET 2, respectively. The gate width ($W_g$) of the FET 1 and the FET 2 was about 190 mm. The gate voltage $V_g$ of 0 V to +4 V was applied. It is shown that $I_d$=0 A for $V_g$=0 V in the FET 1 and $I_d$=0 A for $V_g$=+1 V in the FET 2. This shows that the FET 1 and the FET 2 are normally-off mode FETs. $I_d$ of the FET 1 is larger than $I_d$ of the FET 2 because the thickness of the $Al_xGa_{1-x}N$ layer 12 of the FET 1 is 20 nm, which is larger than the thickness of the $Al_xGa_{1-x}N$ layer 12 (15 nm) of the FET 1, and therefore the 2DEG concentration of the psj region is large, which results in small channel resistance.

(Drain Current ($I_d$)—Gate Voltage ($V_g$) Characteristics)

Figure 4:
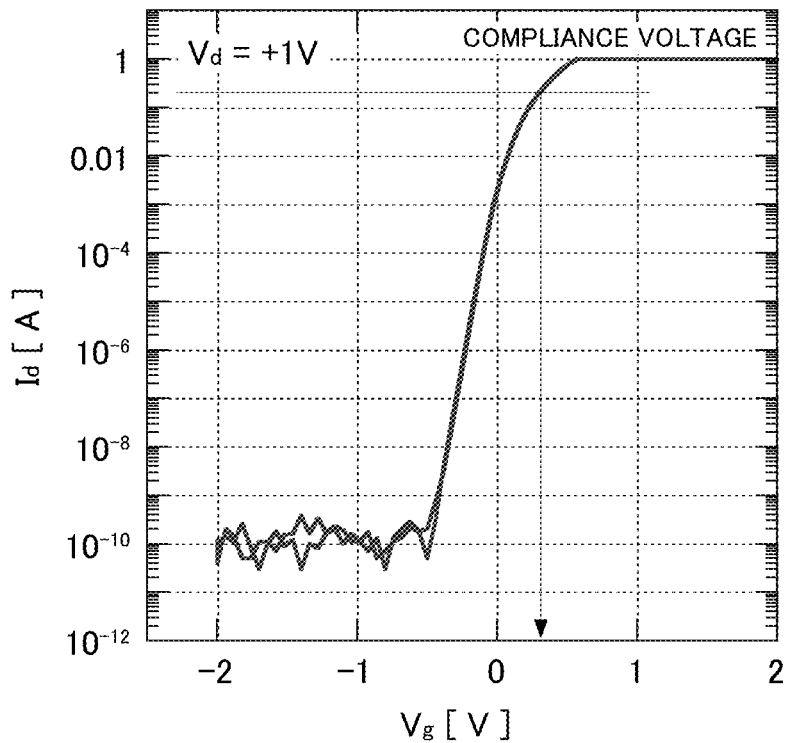
FIG. 4 A schematic view showing the drain current-gate voltage characteristics of the FET 1 prepared to consider the normally-off mode polarization super junction GaN-based FET according to the first embodiment of the invention.
Figure 5:
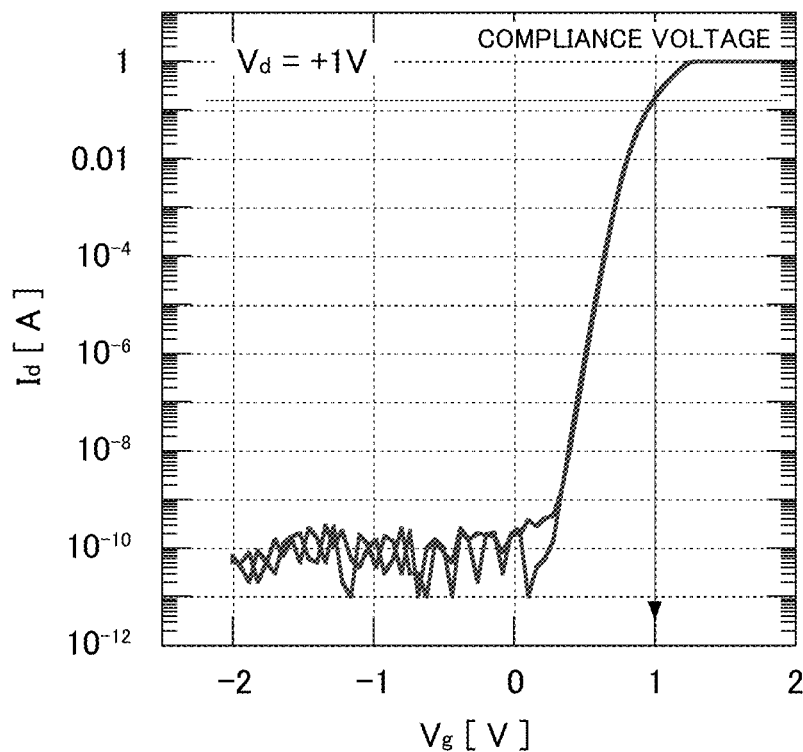
FIG. 5 A schematic view showing the drain current-gate voltage characteristics of the FET 2 prepared to consider the normally-off mode polarization super junction GaN-based FET according to the first embodiment of the invention.

In order to evaluate the threshold voltage $V_{th}$, the $I_d$-$V_g$ characteristics of the FET 1 and the FET 2 were measured. The results are shown in FIG. 4 and FIG. 5. Vertical axes of FIG. 4 and FIG. 5 are the logarithmic axis. Although $V_g$ was changed from −2 V to +4 V, $V_g$ is shown only to +2 V in FIG. 4 and FIG. 5. The maximum value of $I_d$ was set to 1 A due to the reason of measurement system used. In FIG. 2 and FIG. 3, the saturation currents were 20 A, 15 A, respectively. On the other hand, in FIG. 4 and FIG. 5, $V_g$ showing the value of $I_d$ of 1/100 of the saturation current. If this $V_g$ is denoted as $V_{th}$, $V_{th}$ of the FET 1 is about +0.3 V and $V_{th}$ of the FET 2 is +1.0 V. Here, $V_{th}$ was defined as $V_g$ when $I_d$ is 1/100 of the maximum rating drain current because the circuit system can be substantially protected by the normally-off mode FET when the gate signal was lost.

(Voltage Resistance Characteristics)

Figure 6:
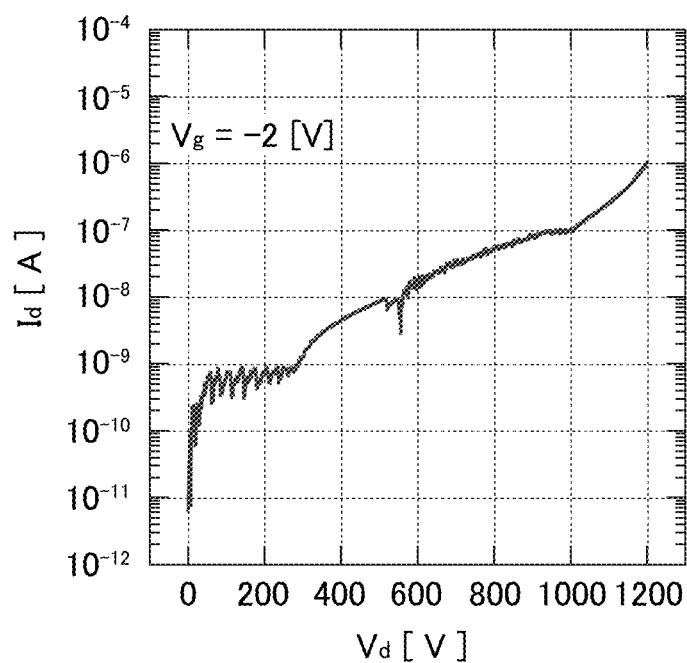
FIG. 6 A schematic view showing the drain current-drain voltage characteristics of the FET 1 prepared to consider the normally-off mode polarization super junction GaN-based FET according to the first embodiment of the invention.
Figure 7:
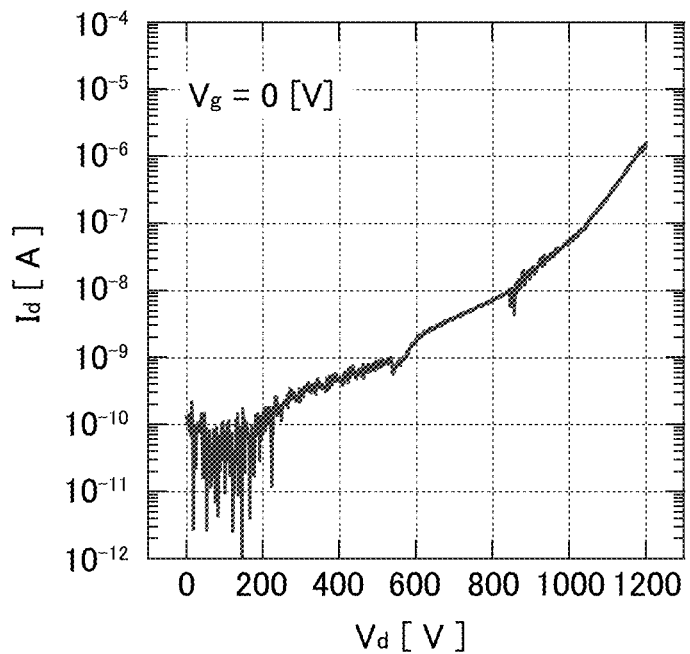
FIG. 7 A schematic view showing the drain current-drain voltage characteristics of the FET 2 prepared to consider the normally-off mode polarization super junction GaN-based FET according to the first embodiment of the invention.

In order to evaluate the voltage resistance of the FET 1 and the FET 2, $I_d$ was measured by applying $V_d$ to 1200 V at the maximum when $V_g$=−2 V was set in the FET 1 and $V_g$=0 V was set in the FET 2. FIG. 6 and FIG. 7 show the result of measurement of $I_d$-$V_d$ characteristics of the FET 1 and the FET 2, respectively. As shown in FIG. 6 and FIG. 7, voltage resistance of the FET 1 and the FET 2 is very high and leakage current was about 1 μA when $V_d$=1200 V.

(Relation Between the Thickness of the $Al_xGa_{1-x}N$ Layer 12 and $V_{th}$)

The growth of the p-type $In_yGa_{1-y}N$ layer on the GaN layer is restricted by the difference of lattice constants and the solubility of Mg dopants. Therefore, when an excellent polarization super junction GaN-based FET is manufactured, the limits of the In composition y and the Mg concentration are about 0.2 (about 20%) and $1\times10^{20}$ $cm^{-3}$, respectively. Here, when the condition of the p-type $In_yGa_{1-y}N$ layer was fixed, considered was the thickness of the $Al_xGa_{1-x}N$ layer which has the most significant influence on $V_{th}$. The Al composition x of the $Al_xGa_{1-x}N$ layer was set to 0.21(21%).

Newly prepared were FETs having the thickness of the $Al_xGa_{1-x}N$ layer having three levels of 25 nm, 27 nm and 30 nm and having the same structure as the FET 1 and the FET 2 other than this. Here, $W_g$=1 mm was used. The FET having the thickness of the $Al_xGa_{1-x}N$ layer 12 of 25 nm is referred as the FET 3. The FET having the thickness of the $Al_xGa_{1-x}N$ layer 12 of 27 nm is referred as the FET 4. The FET having the thickness of the $Al_xGa_{1-x}N$ layer 12 of 30 nm is referred as the FET 5.

Figure 8:
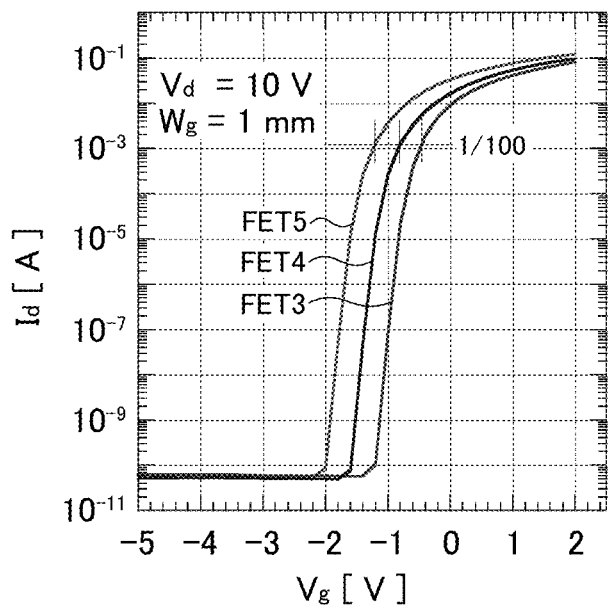
FIG. 8 A schematic view showing the drain current-gate voltage characteristics of the FETs 3, 4, 5 prepared to consider the normally-off mode polarization super junction GaN-based FET according to the first embodiment of the invention.

The $I_d$-$V_d$ characteristics of the FET 3, the FET 4 and the FET 5 were measured. The result is shown in FIG. 8. As shown in FIG. 8, $V_{th}$ shifted deeply (to the negative side) in the order of the FET 3, the FET 4 and the FET 5 having the thickness of the $Al_xGa_{1-x}N$ layer 12 sequentially increasing.

Figure 9:
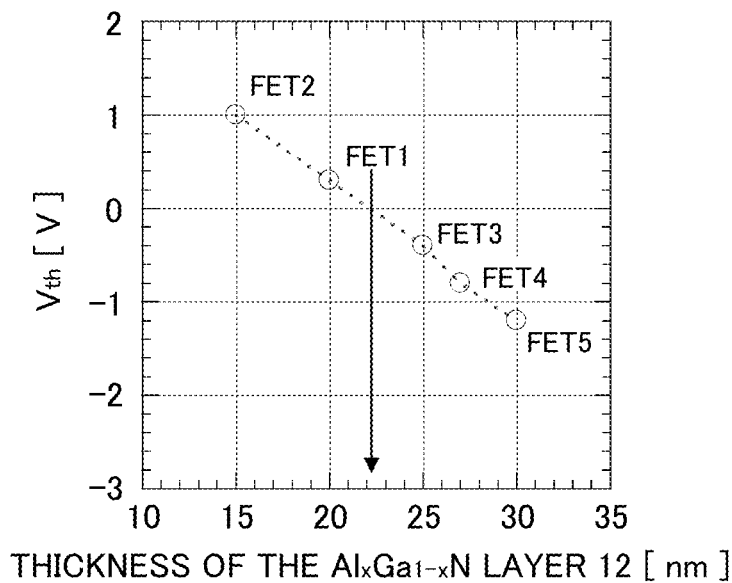
FIG. 9 A schematic view showing the threshold voltage $V_{th}$ plotted against the thickness d of the $Al_xGa_{1-x}N$ layer (x=0.21) of the FETs 1, 2, 3, 4, 5 prepared to consider the normally-off mode polarization super junction GaN-based FET according to the first embodiment of the invention.
Figure 10:
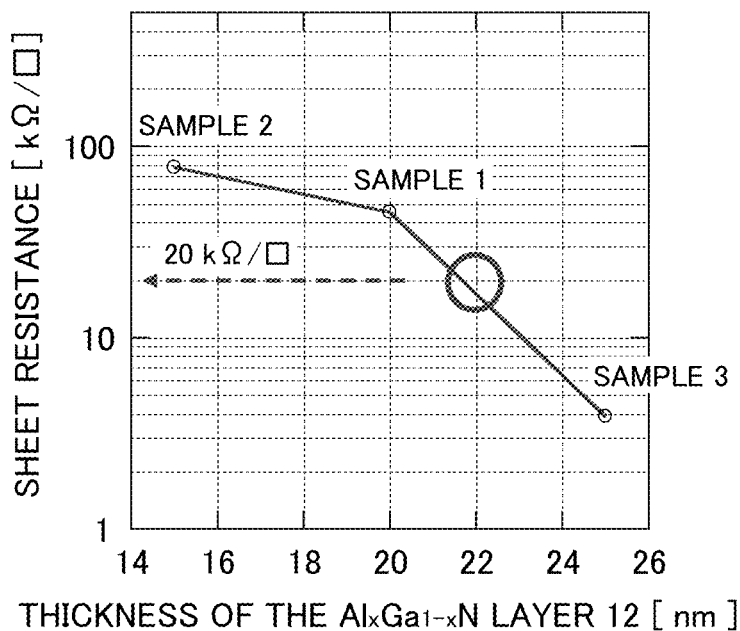
FIG. 10 A schematic view showing the sheet resistance of the epi substrate plotted against the thickness d of the $Al_xGa_{1-x}N$ layer (x=0.21) of the samples 1, 2, 3 prepared to consider the normally-off mode polarization super junction GaN-based FET according to the first embodiment of the invention.

FIG. 9 shows $V_{th}$ at 1/100 of the saturation current value in FIG. 8 of the FET 3, the FET 4 and the FET 5 plotted against the thickness of the $Al_xGa_{1-x}N$ layer 12. In FIG. 9, $V_{th}$ of the FET 1 and the FET 2 is also plotted. It is understood from FIG. 9 that when the thickness of the $Al_xGa_{1-x}N$ layer 12 is not larger than 22 nm, $V_{th}$>0. The sheet resistance of the epi substrate in which the thickness of the $Al_xGa_{1-x}N$ layer 12 is 25 nm was examined. The sheet resistance measured by eddy current method of the epi substrate on which the FET 3 in which the thickness of the $Al_xGa_{1-x}N$ layer 12 is 25 nm was formed (referred as a sample 3) was 3.879 kΩ/□ (average value). FIG. 10 shows plotting of the sheet resistance of the sample 1, the sample 2 and the sample 3. It is understood from FIG. 10 that the sheet resistance of the epi substrate in which the thickness of the $Al_xGa_{1-x}N$ layer 12 is 22 nm and $V_{th}$ is just 0 V was about 20 kΩ/□. Therefore, condition of realizing normally-off mode is that the epi substrate has the sheet resistance not smaller than this. From FIG. 10, the sheet resistance of the sample 1 is 45 kΩ/□. Therefore, if the sheet resistance is not smaller than 45 kΩ/□, it is possible to realize normally-off mode more surely.

(Condition of the $Al_xGa_{1-x}N$ Layer 12 for Realizing Normally-Off Mode)

It is understood from the above result that if the thickness of the $Al_xGa_{1-x}N$ layer 12 having x=0.21 (21%) is not larger than about 22 nm, the polarization super junction GaN-based FET becomes normally-off. However, it is considered that the structure for realizing $V_{th}$>0 is not limited to the above structure.

Therefore, based on the above knowledge, condition for realizing normally-off mode of the polarization super junction GaN-based FET is considered again.

The $Al_xGa_{1-x}N$ layer 12 is considered again.

$V_{th}$ of a normal AlGaN/GaN HEMT is expressed by the following equation.

[Eq 1]

$$V_{th} = \phi_B - \frac{qN_{PZ}d}{\epsilon_s} - \frac{\Delta E_c}{q} \quad (1)$$

Here, $\phi_B$ is Schottky barrier height, q is electron charge, $\epsilon_s$ is dielectric constant, $N_{PZ}$ is the polarization charge amount, d is the thickness of the AlGaN layer and $\Delta E_c$ is the barrier height of the conduction band of AlGaN/GaN. The polarization charge amount $N_{PZ}$ relates to the Al composition x of the AlGaN layer.

$V_{th}=0$ V, in brief, is condition that the 2DEG below the gate electrode depletes at $V_g=0$ V.

With respect to the electron concentration of the AlGaN/GaN HEMT which is the base of the polarization super junction GaN-based FET, supposing electron mobility is ~1000 cm$^2$/Vs, by calculating backward from the sheet resistance of 575Ω/□ obtained by the experimental value of the sheet resistance described above, the 2DEG concentration is about 1.08×10$^{13}$ cm$^{-2}$. The 2DEG concentration corresponds to $V_{th}$ of −4 V of the normal HEMT, which is a very deep negative value. Therefore, in the normally-off mode polarization super junction GaN-based FET, while the normal AlGaN/GaN HEMT structure has a negative $V_{th}$, $\phi_B$ of the equation (1) is lifted up by adding the stacking structure of the p-type In$_y$Ga$_{1-y}$N layer 15/the p-type GaN layer 14/the undoped GaN layer 13 to the AlGaN/GaN HEMT structure.

Paying attention to the second term of the equation (1), since $V_{th}=0$ V was obtained experimentally for the Al$_x$Ga$_{1-x}$N layer 12 having x=0.21 (21%) and d=22 nm, the limitation condition of $V_{th} \leq 0$ is $$N_{PZ}d \leq N_{PZ}(x=0.21) \times 22 \text{ [nm]} \quad (2)$$

Here, $N_{PZ}$ (x=0.21) means $N_{PZ}$ for x=0.21.

Figure 11:
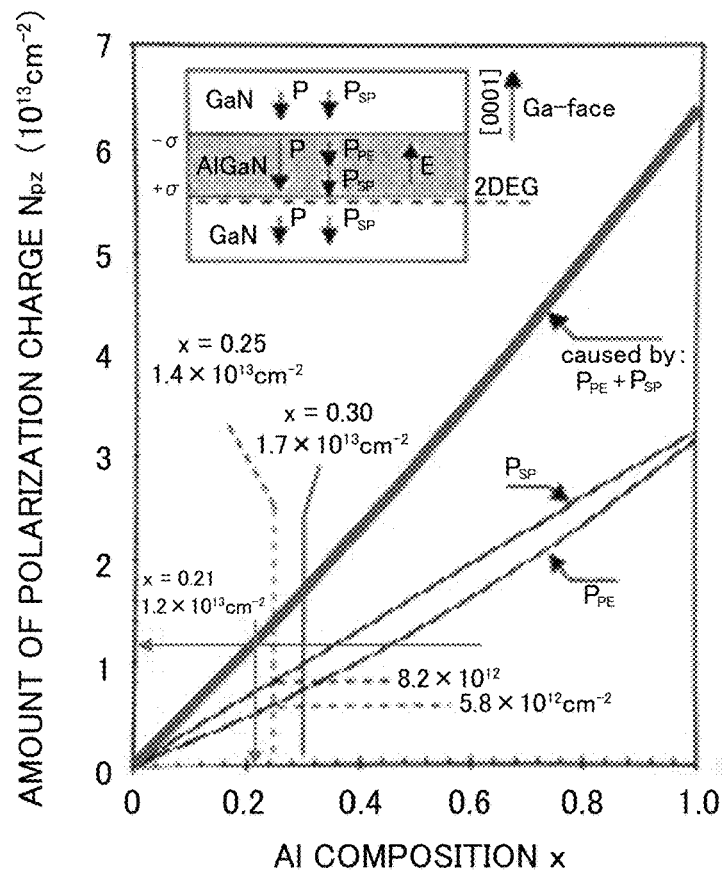
FIG. 11 A schematic view showing the relation between the Al composition x of the $Al_xGa_{1-x}N$ layer and the polarization charge amount of the FETs 1, 2, 3, 4, 5 prepared to consider the normally-off mode polarization super junction GaN-based FET according to the first embodiment of the invention.

FIG. 11 shows the relation between the polarization charge amount $N_{PZ}$ of the Al$_x$Ga$_{1-x}$N/GaN HEMT structure and the Al composition x of the Al$_x$Ga$_{1-x}$N layer 12 (reprinted from FIG. 9 of non-patent literature 3 after touched in partly). From FIG. 11, $N_{PZ}$ (x=0.21) is $$1.2 \times 10^{13} \text{[cm}^{-2}\text{]} \quad (3)$$

Therefore, from the equation (2) and the equation (3) condition of the base Al$_x$Ga$_{1-x}$N/GaN is as follows.

$$N_{PZ}d \leq N_{PZ}(x=0.21) \times 22 \text{ [nm]} = 26.4 \times 10^{13} \text{[cm}^{-2} \text{ nm]}$$

That is, $$N_{PZ}d \leq 2.64 \times 10^{14} \text{[cm}^{-2} \text{ nm]} \quad (4)$$

That is, the equation (4) can be used as stacking condition of the base Al$_x$Ga$_{1-x}$N/GaN without limiting the Al composition x to 0.21.

As described above, according to the first embodiment, it is possible to easily realize a normally-off mode polarization super junction GaN-based FET by the layer structure of the undoped GaN layer 11, the Al$_x$Ga$_{1-x}$N layer 12, the undoped GaN layer 13, the p-type GaN layer 14 and the p-type In$_y$Ga$_{1-y}$N layer 15 and the limitation of condition such as $N_{PZ}$ d≤2.64×10$^{14}$ [cm$^{-2}$ nm], without using complicated circuits such as a cascode circuit or modified cascode circuit using low voltage resistance normally-off mode Si MOS transistors such as FIG. 57A, FIG. 57B, FIG. 57C and FIG. 57D of patent literature 1 or FIGS. 32A~E of patent literature 2 and further without using complicated processes such as forming a deep groove in the Al$_x$Ga$_{1-x}$N layer 12 and burying the gate electrode in the groove as shown in FIG. 31 of patent literature 2.

The Second Embodiment

[The Normally-Off Mode Polarization Super Junction GaN-Based FET]

Figure 12:
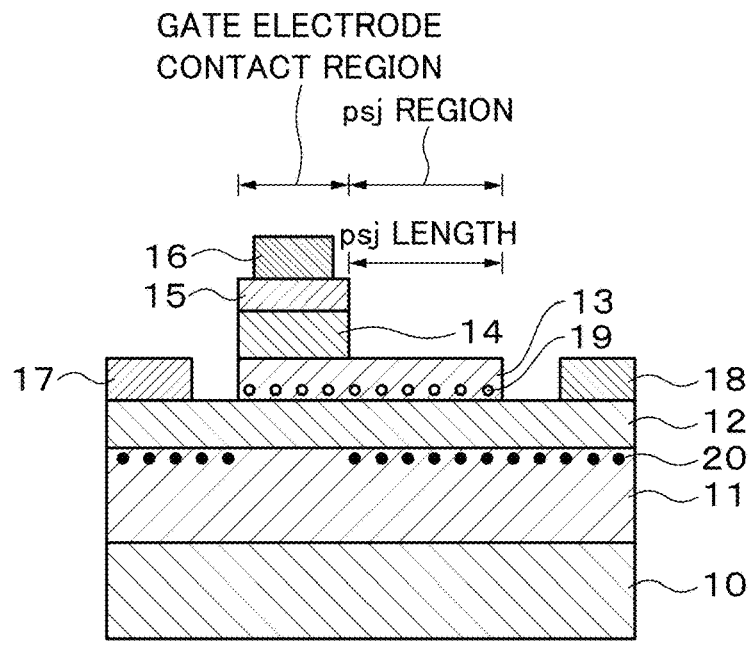
FIG. 12 A cross-sectional view showing a normally-off mode polarization super junction GaN-based FET according to a second embodiment of the invention.

As shown in FIG. 12, the normally-off mode polarization super junction GaN-based FET according to the second embodiment is different from the normally-off mode polarization super junction GaN-based FET according to the first embodiment in that the p-type GaN layer 14 does not exist in the polarization super junction region similar to patent literature 1. Other than the above is the same as the normally-off mode polarization super junction GaN-based FET according to the first embodiment.

[Method for Manufacturing the Normally-Off Mode Polarization Super Junction GaN-Based FET]

The method for manufacturing the normally-off mode polarization super junction GaN-based FET is the same as the method for manufacturing the normally-off mode polarization super junction GaN-based FET according to the first embodiment except that the p-type GaN layer 14 is not finally formed on the undoped GaN layer 13 in the polarization super junction region.

According to the second embodiment, the same advantage as the first embodiment can be obtained.

Heretofore, embodiments of the present invention have been explained specifically. However, the present invention is not limited to these embodiments, but contemplates various changes and modifications based on the technical idea of the present invention.

For example, numerical numbers, structures, shapes, materials and the like presented in the aforementioned embodiments are only examples, and the different numerical numbers, structures, shapes, materials and the like may be used as needed.

EXPLANATION OF REFERENCE NUMERALS

10 Substrate
11 Undoped GaN layer
12 Al$_x$Ga$_{1-x}$N layer
13 Undoped GaN layer
14 p-type GaN layer
15 p-type In$_y$Ga$_{1-y}$N layer
16 Gate electrode
17 Source electrode
18 Drain electrode
19 2DHG
20 2DEG

The invention claimed is:

1. A normally-off mode polarization super junction GaN-based field effect transistor, comprising:
a first undoped GaN layer,
an AlxGa1−xN layer (0<x<1) on the first undoped GaN layer,
a second undoped GaN layer having an island-like shape on the AlxGa1−xN layer,
a p-type GaN layer on the second undoped GaN layer,
a p-type InyGa1−yN layer (0<y<1) on the p-type GaN layer,
a gate electrode electrically connected to the p-type InyGa1−yN layer,
a source electrode on the AlxGa1−xN layer; and
a drain electrode on the AlxGa1−xN layer, the p-type GaN layer existing on the whole surface of the second undoped GaN layer or on only one side of the surface of the second undoped GaN layer on the side of the source electrode, the p-type InyGa1-yN layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode, NPZ d≤2.64×1014 [cm-2 nm] being satisfied when the polarization charge amount at the hetero-interface between the AlxGa1-xN layer and the first undoped GaN layer and the hetero-interface between the AlxGa1-xN layer and the second undoped GaN layer is denoted as NPZ and the thickness of the AlxGa1-xN layer is denoted as d, the In composition y and the thickness t of the p-type InyGa1-yN layer being selected to satisfy y×t≤0.20×5 [nm].

2. The normally-off mode polarization super junction GaN-based field effect transistor according to claim 1 wherein the sheet resistance of the epi substrate in which the first undoped GaN layer, the AlxGa1-xN layer, the second undoped GaN layer, the p-type GaN layer and the p-type InyGa1-yN layer are stacked on the whole surface of a substrate is not smaller than 20 KΩ/□.

3. The normally-off mode polarization super junction GaN-based field effect transistor according to claim 2 wherein the sheet resistance of the epi substrate is not smaller than 45 kΩ/□.

4. Electrical equipment, comprising:
at least a transistor,
the transistor being
a normally-off mode polarization super junction GaN-based field effect transistor, comprising:
a first undoped GaN layer,
an AlxGa1-xN layer (0<x<1) on the first undoped GaN layer,
a second undoped GaN layer having an island-like shape on the AlxGa1-xN layer,
a p-type GaN layer on the second undoped GaN layer,
a p-type InyGa1-yN layer (0<y<1) on the p-type GaN layer,
a gate electrode electrically connected to the p-type InyGa1-yN layer,
a source electrode on the AlxGa1-xN layer; and
a drain electrode on the AlxGa1-xN layer,
the p-type GaN layer existing on the whole surface of the second undoped GaN layer or on only one side of the surface of the second undoped GaN layer on the side of the source electrode,
the p-type InyGa1-yN layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode.

* * * * *